(12) United States Patent
Arai

(10) Patent No.: US 6,528,864 B1
(45) Date of Patent: Mar. 4, 2003

(54) SEMICONDUCTOR WAFER HAVING REGULAR OR IRREGULAR CHIP PATTERN AND DICING METHOD FOR THE SAME

(75) Inventor: Kazuhisa Arai, Tokyo (JP)

(73) Assignee: Disco Corporation, Tokyo (JP)

( * ) Notice: Subject to any disclaimer, the term of this patent is extended or adjusted under 35 U.S.C. 154(b) by 23 days.

(21) Appl. No.: 09/708,543

(22) Filed: Nov. 9, 2000

(30) Foreign Application Priority Data

Nov. 19, 1999 (JP) ............................................ 11-329764

(51) Int. Cl.⁷ ............................................... H01L 21/44
(52) U.S. Cl. ...................................... 257/620; 257/622
(58) Field of Search ............................... 257/620, 622; 438/110, 113, 460, 462, 977, FOR 386

(56) References Cited

U.S. PATENT DOCUMENTS

| | | | | |
|---|---|---|---|---|
| 4,932,064 A | * | 6/1990 | Kasahara | ................... 257/620 |
| 6,075,280 A | * | 6/2000 | Yung et al. | ................. 257/620 |
| 6,326,697 B1 | * | 12/2001 | Farnworth | ................... 257/620 |

* cited by examiner

*Primary Examiner*—Olik Chaudhuri
*Assistant Examiner*—Thanh V Pham
(74) *Attorney, Agent, or Firm*—Rader, Fishman & Grauer PLLC

(57) ABSTRACT

Disclosed is a semiconductor wafer whose pattern is composed of a plurality of chip areas delimited by a plurality of streets which at least one or more streets are not straight. Those chip areas may be rectangular ones of same or different sizes delimited by streets which are wholly or partly staggered, or ones of different shapes and/or sizes delimited by streets which are bent or curved so that they may separate adjacent chip areas. Such a semiconductor wafer can be separated into chips by: coating one of the opposite surfaces of each semiconductor wafer with a photoresistive film; exposing the coated surface of the semiconductor wafer to the light to remove the coating area lying on the streets; subjecting the street-exposed wafer surface to chemical etching to make grooves in conformity with the streets; and separating the semiconductor wafer into chips. The separating step may include making grooves deep enough to reach the front side of the wafer by chemical etching or grinding the grooved wafer on its rear side to remove the remaining thickness of the grooved wafer.

3 Claims, 7 Drawing Sheets

SEMICONDUCTOR WAFER HAVING REGULAR OR IRREGULAR CHIP PATTERN AND DICING METHOD FOR THE SAME

BACKGROUND OF THE INVENTION

1. Field of the Invention

The present invention relates to a semiconductor wafer to be diced into semiconductor chips of same or different shapes for making the best use of semiconductor materials and sizes and a method of dicing such a semiconductor wafer.

2. Related Arts

Referring to FIG. 12, a semiconductor wafer W has a lattice pattern formed therein, delimiting a plurality of chip areas P of same size by crossing streets S. The semiconductor wafer W can be cut and divided into separate chips P by a dicing machine.

Use of such a dicing machine requires crosswise arrangement of straight streets S, thus preventing the cutting of a semiconductor wafer into chips of different shapes and/or sizes, such as circle, trapezoid, "L"-shape, concave or convex shape. Also disadvantageously, use of the dicing machine makes it difficult to avoid the waste of semiconductor material, allowing a significant amount of remaining material to be left and thrown away.

SUMMARY OF THE INVENTION

One object of the present invention is to provide a dicing method for dividing semiconductor wafer into chips of regular or irregular shapes and sizes.

Another object of the present invention is to provide a semiconductor wafer having a regular or irregular chip pattern formed thereon.

According to one aspect of the present invention, a semiconductor wafer whose pattern is composed of a plurality of chip areas delimited by a plurality of streets which at least one or more streets are not straight.

The pattern of the semiconductor wafer may be composed of rectangular chip areas of same size delimited by a plurality of streets which are wholly or partly staggered to be in conformity with arrangement of the rectangular chip areas.

The staggered-lattice formation of chip areas permits the whole area of semiconductor wafer to be used to possible extent, avoiding the waste of semiconductor material. Specifically the number of rectangular chips of same size can be increased 5 to 10 or more percent relative to the regular lattice formation of chip areas.

Further, the pattern of the semiconductor wafer may be composed of a plurality of chip areas of different shapes and/or sizes delimited by a plurality of streets which are so bent or curved that they may separate adjacent chip areas.

According to another aspect of the present invention, a method of dividing a semiconductor wafer into chips of rectangular or different shapes and/or sizes comprises: first step of coating one of the opposite surfaces of the semiconductor wafer with a photo-resistive material; second step of selectively exposing the photo-resistive coating to the light, thereby removing the coating area lying over the streets delimiting chip areas; third step of subjecting the semiconductor wafer having its streets exposed to chemical etching to make grooves in conformity with the street pattern; and fourth step of separating the semiconductor wafer into chips.

Grooves may be made a predetermined distance deep at the third step; and the semiconductor wafer may be grounded on the other surface to remove the remaining thickness of the grooved semiconductor wafer, thus separating it into chips.

The grinding of the semiconductor wafer on its other surface permits the semiconductor wafer to be easily separated into chips no matter what shapes and/or sizes they may have.

Grooves may be made deep enough to reach the one surface of the semiconductor wafer, thereby separating the semiconductor wafer into chips.

The chemical etching may be wet-etching or dry-etching. The dry-etching permits each groove to be several tens microns deep while the groove remains several microns wide.

Other objects and advantages of the present invention will be understood from the following description of preferred embodiments, which are shown in accompanying drawings.

DETAILED DESCRIPTION OF PREFERRED EMBODIMENT

Figure 1:
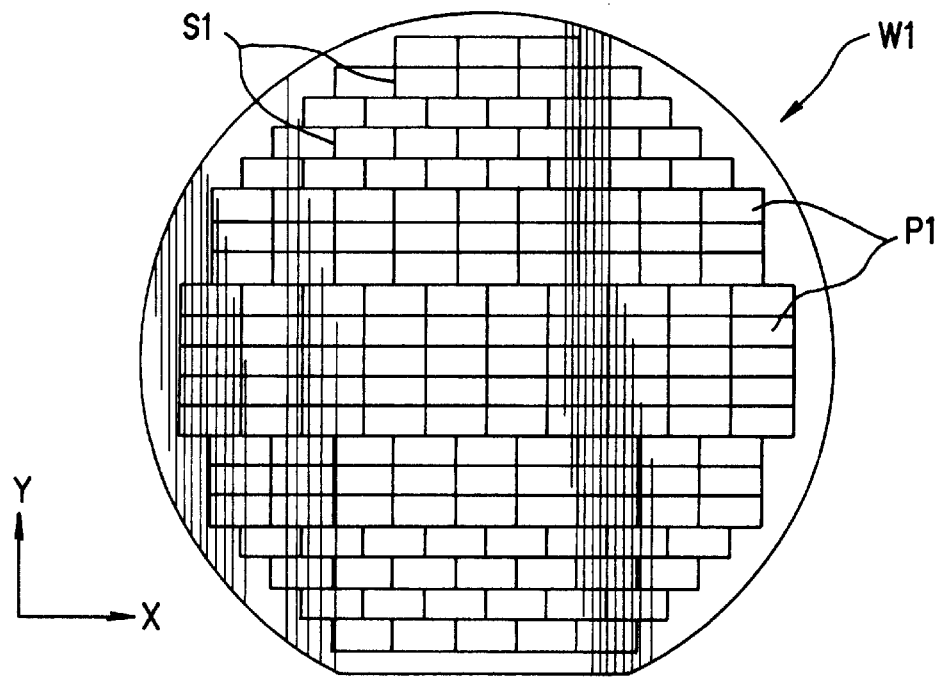
FIG. 1 is a plane view of a semiconductor wafer according to a first embodiment, showing its rear side.
Figure 12:
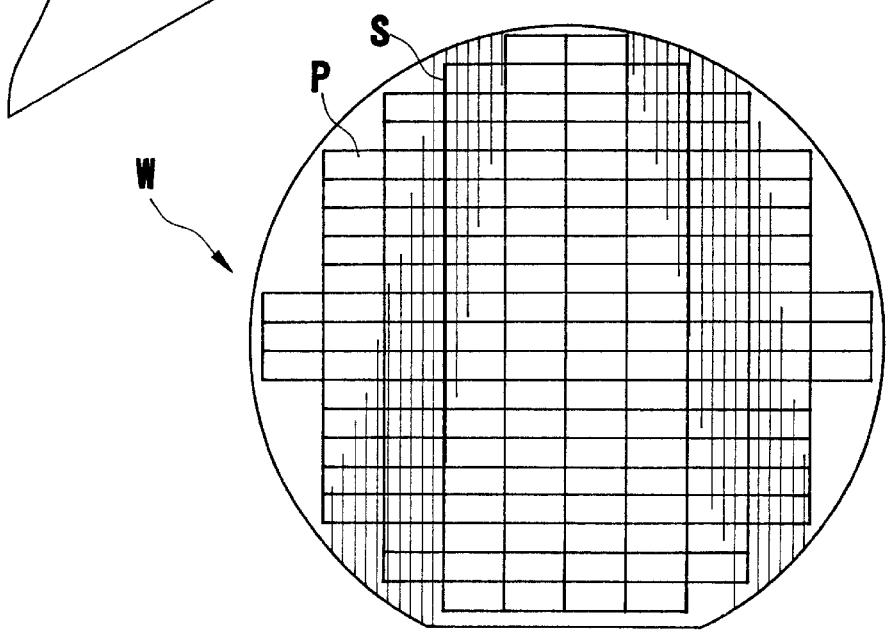
FIG. 12 is a plane view of a conventional semiconductor wafer.

Referring to FIG. 1, a semiconductor wafer W1 having a staggered-lattice pattern according to the present invention is as large as the conventional semiconductor wafer W of FIG. 12, and each chip area P1 in the semiconductor wafer W1 has same size and shape as the chip P in the conventional semiconductor wafer W. The semiconductor wafer W1 is different from the conventional semiconductor wafer W in arrangement of chip areas P1.

Specifically, sub-arrangements of chip areas P1 are stacked longitudinally in the Y-axial direction, and are staggered laterally in the X-axial direction. Accordingly longitudinal streets of the sub-arrangements of chip areas are staggered laterally in the X-axial direction.

The staggered-lattice formation of chip areas permits the whole area of semiconductor wafer to be used to possible extent, minimizing the waste of semiconductor material. Specifically the semiconductor wafer W1 of FIG. 1 has 159 chip areas P1 formed thereon whereas the conventional wafer W of FIG. 12 has 144 chip areas P formed thereon. The number of rectangular chips of same size is increased 10 or more percent simply by changing the arrangement of chip areas.

Figure 2:
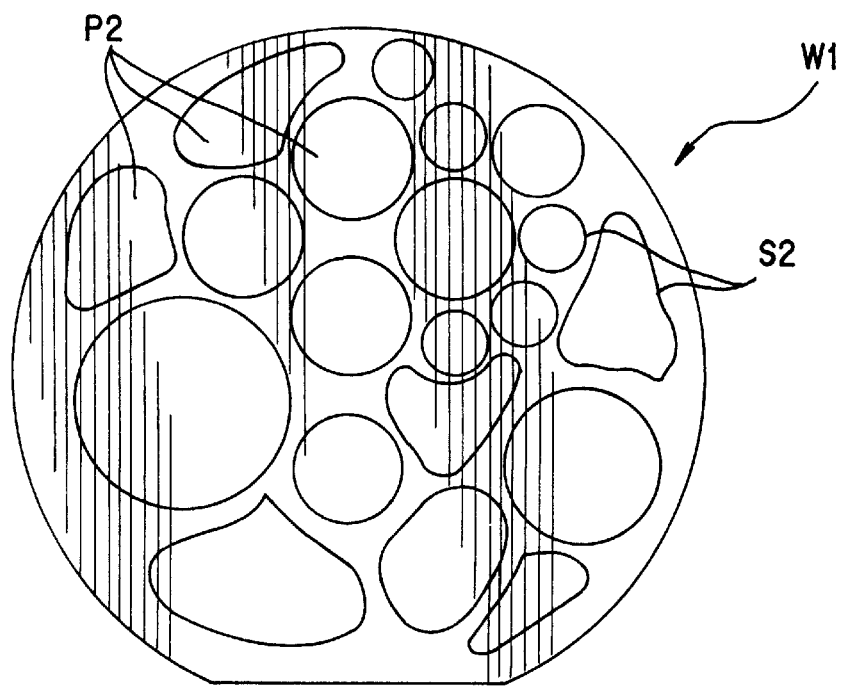
FIG. 2 is a plane view of a semiconductor wafer according to a second embodiment, showing its rear side.

Referring to FIG. 2, a semiconductor wafer W2 according to the second embodiment has a plurality of chip areas P2 of circles and irregular curved shapes formed thereon. These chip areas P2 have streets S2 running therebetween.

Figure 3:
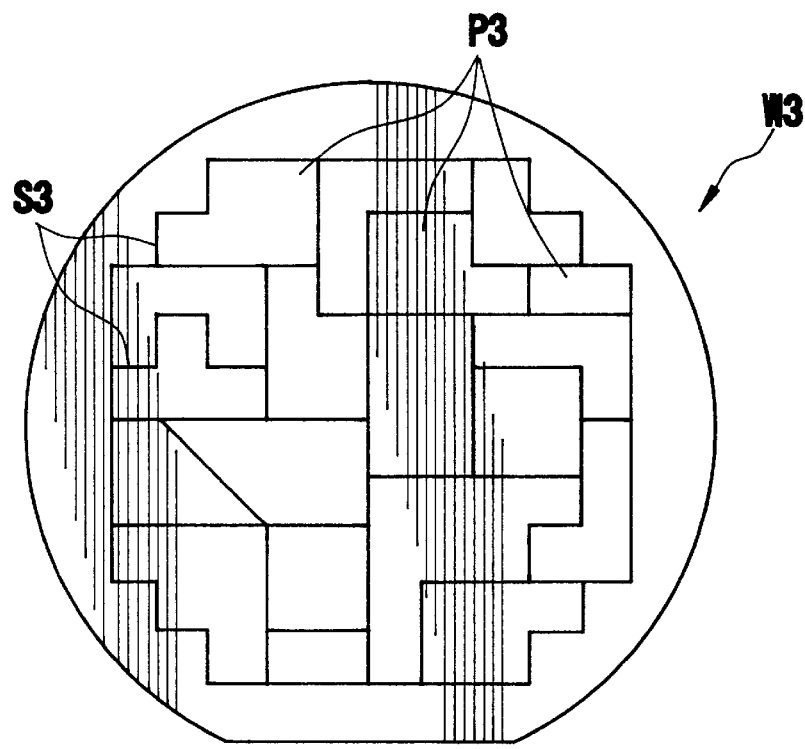
FIG. 3 is a plane view of a semiconductor wafer according to a third embodiment, showing its rear side.

Referring to FIG. 3, a semiconductor wafer W3 according to the third embodiment has a plurality of chip areas P3 of rectangular and irregular polygonal shapes formed thereon. These chip areas P3 have streets S3 running therebetween.

Figure 4:
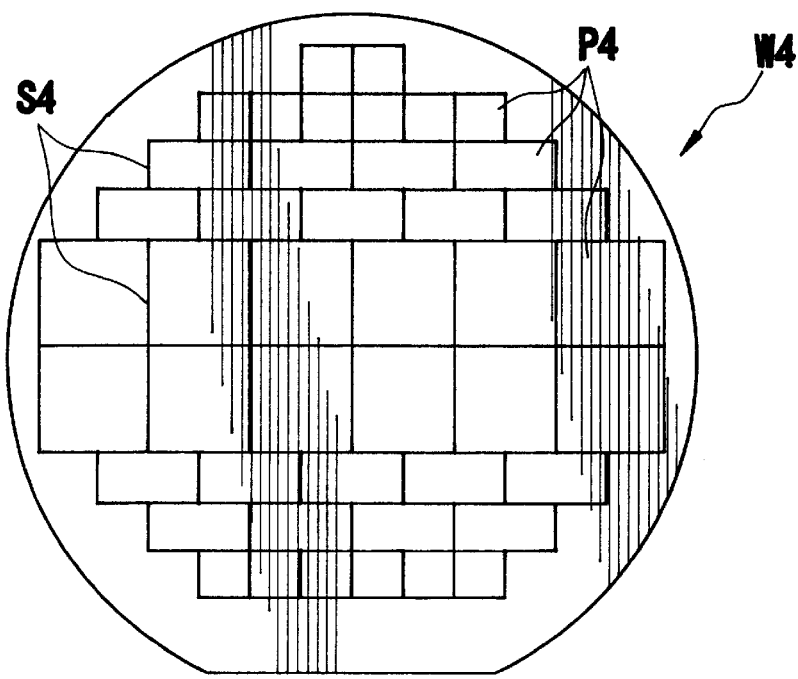
FIG. 4 is a plane view of a semiconductor wafer according to a fourth embodiment, showing its rear side.
Figure 5:
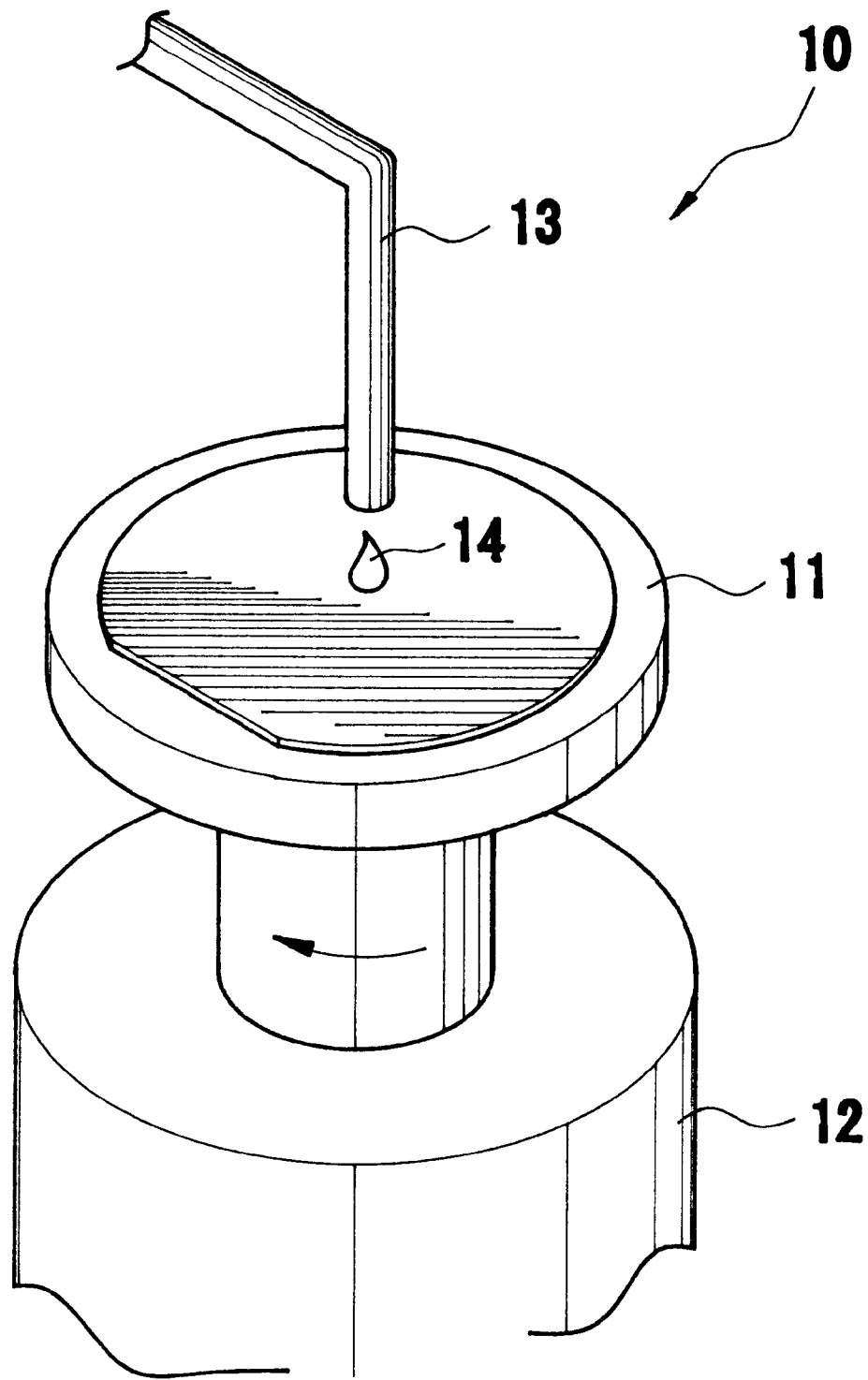
FIG. 5 is a perspective view of a spin-coating unit, illustrating the first process of the dicing method according to the present invention.

Referring to FIG. 4, a semiconductor wafer W4 according to the fourth embodiment has a plurality of chip areas P4 of rectangular and square shapes of different sizes arranged closely to each other. These chip areas P4 have line segment streets S4 running therebetween. As is the case with the staggered-lattice pattern as shown in FIG. 1, the longitudinal streets S4 of sub-arrangements of chip areas are staggered laterally in the X-axial direction. The lateral streets of the sub-arrangement of square chip areas are separated a distance twice as long as that in each sub-arrangement of rectangular chip areas in the Y-axial direction.

As seen from FIGS. 1 to 4, in every semiconductor wafer chip areas are so arranged as to make full use of the whole area of the semiconductor wafer, minimizing the waste of semiconductor material. Thus, the number of chips per wafer can be increased 5 to 10 or more percent.

Chip areas of different sizes and shapes can be formed on semiconductor wafer by transferring desired shapes thereon with the aid of photo-masks having mask patterns, which are used in exposing the photo-sensitive coating of circuit boards to the light for printing circuit patterns thereon. Streets running between adjacent chip areas cannot be formed to be in regular lattice, or cannot be straight. Therefore, a conventional dicing machine cannot be used in cutting such an irregular-patterned wafer into separate chips of different sizes and/or shapes. Even though such a conventional dicing machine can be used in cutting, for instance, a semiconductor wafer bearing staggered-lattice patterns, the yielding rate of chips will be inhibitably lowered because of difficulty in controlling the dicing machine. The manner in which a semiconductor wafer bearing irregular chip patterns can be diced easily is described below.

Figure 6A:
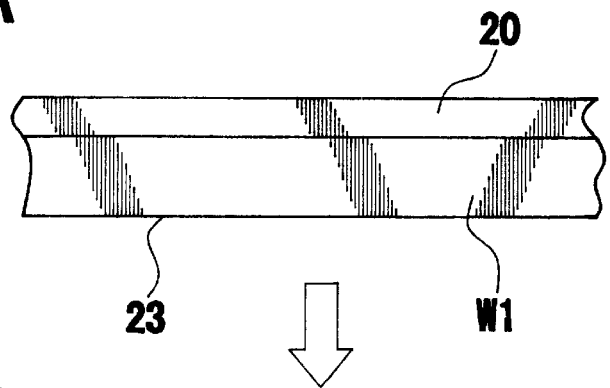
FIGS. 6A to 6D illustrate subsequent processes in the dicing method according to the present invention.

Assuming that a semiconductor wafer W1 of FIG. 1 is divided into rectangular chips P1, first, the semiconductor wafer W1 is put on the holder table 11 of a spin-coating device 10 with its front side up, and the drive unit 12 of the spin-coating device 10 turns the holder table 11 at an increased speed. While rotating the turn table 11, a drop of photo-resistive polymer 14 is made to fall on the turn table 11, thereby allowing the photo-resistive polymer 14 to spread over the circuit-patterned side of the semiconductor wafer W1. Thus, the circuit-patterned side of the semiconductor wafer W1 is coated with photo-resistive polymer 20, as seen from FIG. 6A (First Process).

Figure 6B:
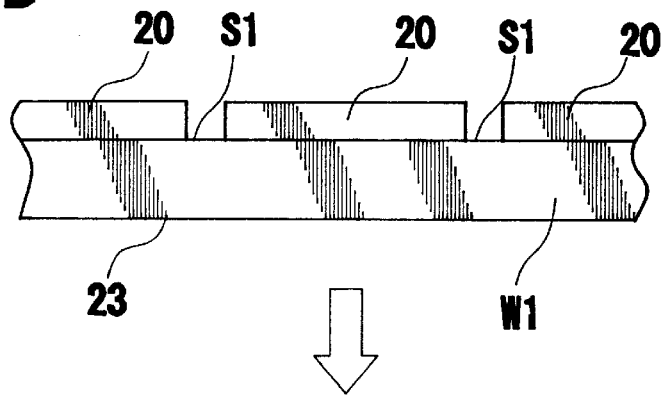

A photo-mask whose apertured-pattern corresponds to the street pattern of the semiconductor wafer W1 is prepared, and the streets S1 of the semiconductor wafer W1 are selectively exposed to the light through the photo-mask, and the exposed coating areas lying on the streets S1 are removed, as seen from FIG. 6B (Second Process).

A plurality of semiconductor wafers W1 each having its streets exposed are contained in a cassette 31a in a dry-etching apparatus 30 (see FIG. 7), and their streets S1 will be subjected to chemical etching.

Figure 7:
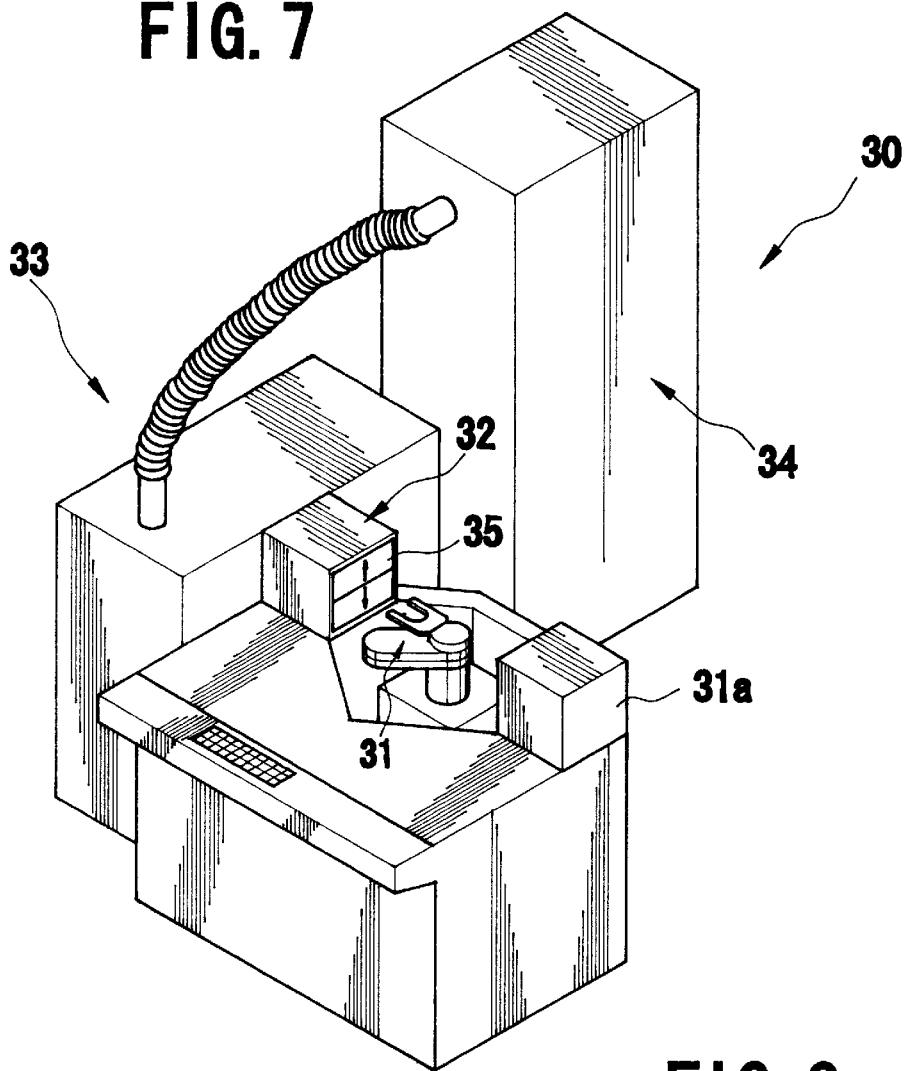
FIG. 7 is a perspective view of a dry etching apparatus used at the third process.

As seen from FIG. 7, the dry-etching apparatus 30 comprises an inlet/outlet means 31 for taking out street-exposed semiconductor wafers from the cassette 31a and for putting finished semiconductor wafers in the cassette 31a, an inlet/outlet chamber 32 for accommodating semiconductor wafers, which are put in/or taken out by the inlet/outlet means 31, an etching chamber 33 and a gas supply 34 for feeding the etching chamber 33 with etching gas.

Figure 8:
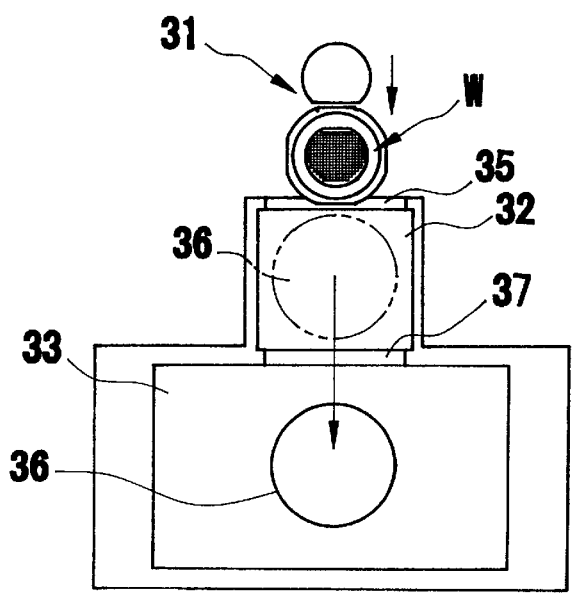
FIG. 8 illustrates how a wafer holder is moved from the inlet/outlet chamber to the processing chamber in the dry etching apparatus.

A selected semiconductor wafer W is taken out from the cassette 31a by the inlet/outlet means 31, and then, the first gate 35 of the inlet/outlet chamber 32 is opened, allowing the semiconductor wafer W1 to be transferred to the wafer holder 36 in the inlet/outlet chamber 32, as seen from FIG. 8.

As shown in the drawing, the inlet/outlet chamber 32 and the processing chamber 33 are separated by the second gate 37. The wafer holder 36 can move from the inlet/outlet chamber 32 to the processing chamber 33 or vice versa when the second gate 37 is opened.

Figure 9:
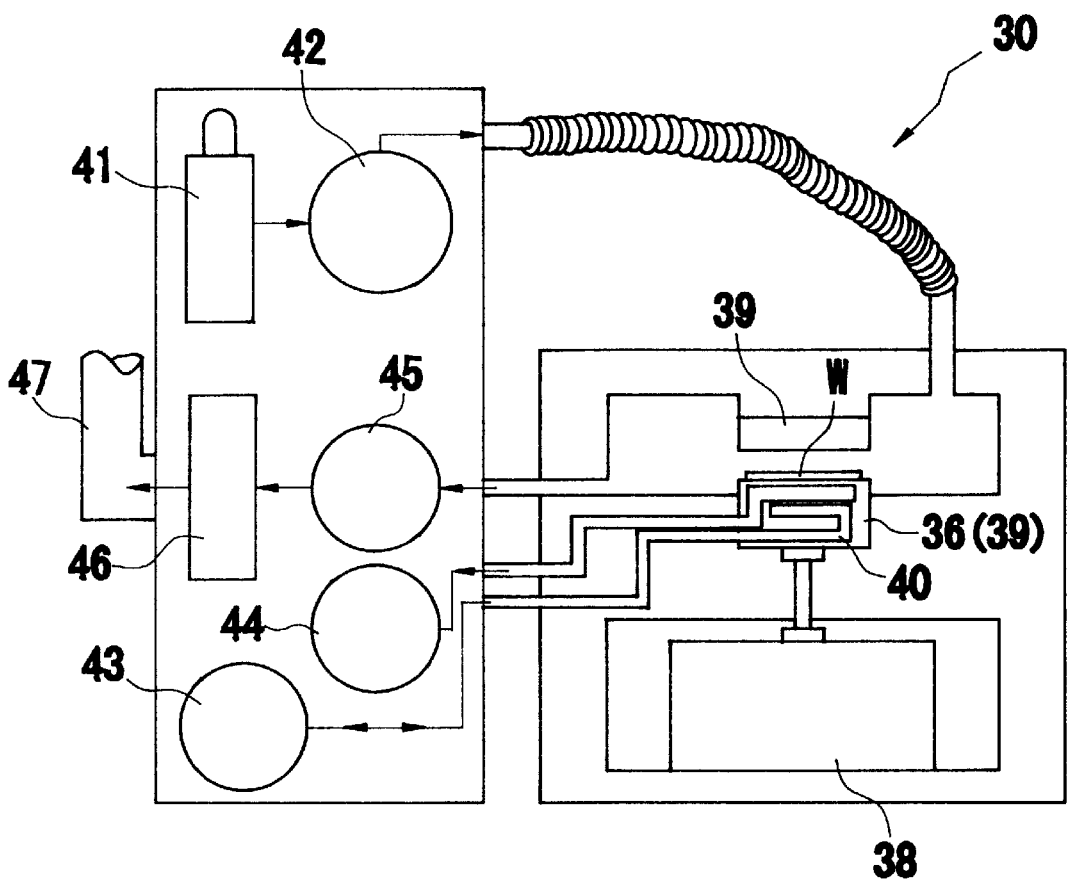
FIG. 9 illustrates the structure of the processing chamber and associated gas supply.

Referring to FIG. 9, a pair of opposing high-frequency electrodes 39 are If connected to a high-frequency power supply-and-resonator 38 in the processing chamber 33. In this particular example one of the opposing electrodes 39 takes the part of wafer holder 36. The wafer holder 36 is equipped with wafer cooling means 40.

The gas supply 34 comprises an etching gas reservoir 41, a pump 42 for pumping the etching gas from the reservoir 41 to the processing chamber 33, a coolant circulator 43 for supplying cooling water to the cooling means 40, a suction pump 44 for applying a negative pressure to the wafer holder 36, another suction pump 45 for sucking the etching gas from the processing chamber 33, and a filter 46 for neutralizing and exhausting the etching gas, which is sucked by the suction pump 45.

Subsequent to the second process the semiconductor wafer W1 is subjected to the dry-etching to etch the streets S1 on the wafer W1. The first gate 35 is opened, and the inlet/outlet means 31 bearing the semiconductor wafer W1 moves in the direction indicated by arrow in FIG. 8, putting the semiconductor wafer W1 on the wafer holder 36 with the front side up in the inlet/outlet chamber 32. Then, the first gate 35 is closed to draw the air from the inlet/outlet chamber 32.

Next, the second gate 37 is opened to allow the wafer holder 36 to enter the processing chamber 33. Then, the etching gas such as thin fluorine is pumped into the processing chamber 33, and at the same time, a high-frequency voltage is applied to the opposing high-frequency electrodes 39 from the high-frequency power supply-and-resonator 38. Thus, dry-etching is effected by establishing plasma on the surface of the semiconductor wafer W1, which is cooled by allowing the circulator 43 to circulate the cooling water in the cooling means 40.

Figure 6C:
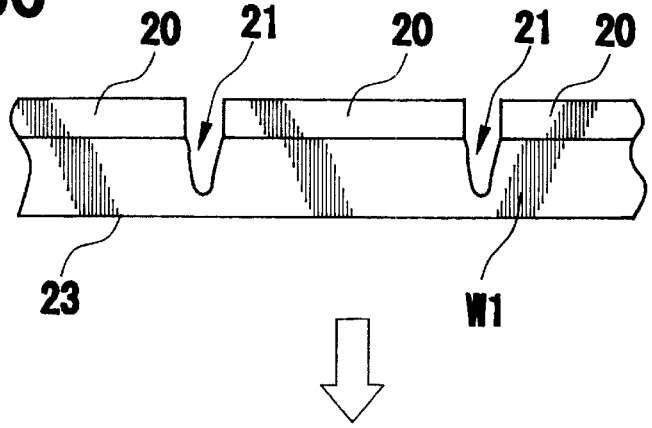
Figure 6D:
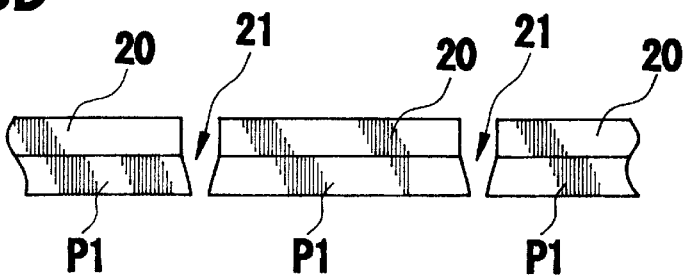

The area of photo-resistive layer lying on the street pattern S1 was selectively removed from the semiconductor wafer W1 at the photo-resistive layer removing step, and therefore, the area of semiconductor wafer other than the street pattern remains covered with the photo-resistive coating. Thus, the exposed street pattern S1 is selectively etched a predetermined depth to make grooves 21 in conformity with the streets S1 as shown in FIG. 6C (Third Process).

After completing the chemical etching the etching gas is drawn from the processing chamber 33 by the suction pump 45, and the etching gas thus drawn is neutralized in the filter unit 46 to be ejected to the surrounding through the duct 47. Then, the processing chamber 33 is evacuated, and the second gate 37 is opened, allowing the wafer holder 36 bearing the finished wafer to enter the inlet/outlet chamber 32. Then, the second gate 37 is closed.

When the semiconductor wafer W is put in the inlet/outlet chamber 32, the first gate 35 is opened to allow the inlet/outlet means 31 to transfer the semiconductor wafer W from the inlet/outlet chamber 32 to the cassette 31a.

Every semiconductor wafer is treated as described above, and then it is put in the cassette 31a. The semiconductor wafer W has grooves 21 made thereon (see FIG. 6C). The dry chemical etching can make each groove several tens microns deep while it remains several microns wide. The chips, therefore, can be arranged closely on the semiconductor wafer, and accordingly the number of chips per wafer increases.

In place of the dry-etching the bath of liquid fluorine may be used to make required grooves on the semiconductor wafer by soaking the same in the bath.

Figure 10:
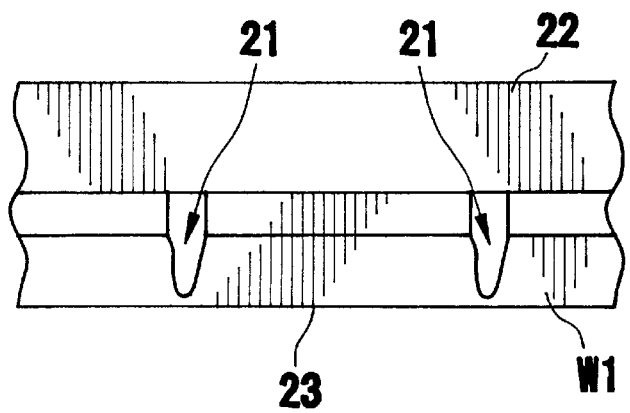
FIG. 10 illustrates how a protective layer is applied to the grooved semiconductor wafer.
Figure 11:
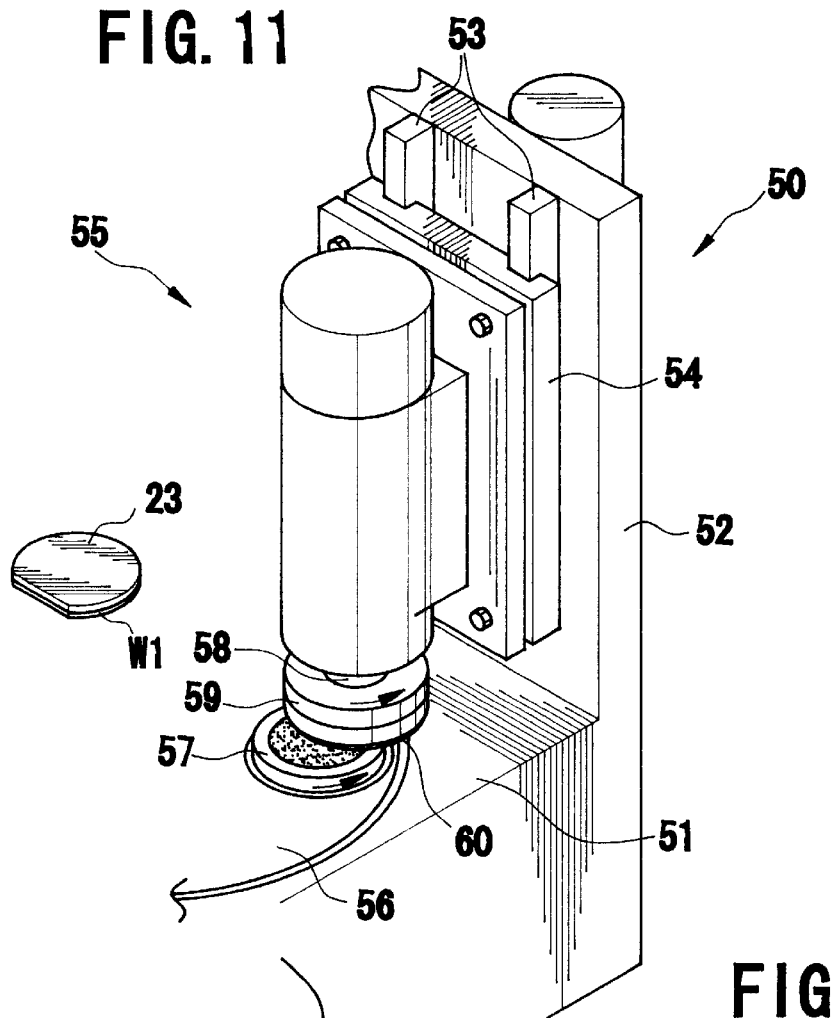
FIG. 11 is a perspective view of a grinding machine to be used at the fourth process.

Referring to FIG. 10, a protective layer 22 is applied to the photo-resistive coating of the grooved wafer W1, and then, the semiconductor wafer W is ground on its rear side 23 by a grinder 50, as shown in FIG. 11. The protective layer 22 may be applied to the grooved wafer W1 after the photo-resistive coating has been stripped off.

The grinder 50 has an upright wall 52 on its base 51, and the upright wall 52 has a slide plate 54 riding on parallel rails 53, which are laid on the upright wall 52. The slide plate 54 can be raised and lowered along with its grinding means 55. A turntable 56 is on the base 51. The turntable 56 has a wafer chuck table 57 provided thereon.

A spindle 58 has a grindstone 60 fixed to its tip via an associated mount 59. Thus, the grindstone 60 can be rotated when the spindle 58 turns.

As seen from FIG. 10, the semiconductor wafer W1 having the protective layer applied to its front side is put on the chuck table 57 with its rear side on, and it is fixedly held on the chuck table 57 by suction. The turntable 56 is rotated to bring the semiconductor wafer W1 under the grinding means 55. Then, the spindle 58 is rotated while the grinding means 55 is lowered, so that the grindstone 58 is put on the rear side 23 of the grooved semiconductor wafer W1, removing the remaining thickness of the grooved semiconductor wafer W1 to separate it into chips P1 (Fourth Process). The photo-resistive coating of each chip is removed by using an appropriate solvent.

The dicing method according to the present invention is described as being applied to a semiconductor wafer having rectangular chip areas arranged in the form of staggered lattice as shown in FIG. 1, but it can be equally applied to semiconductor wafers having chips of different sizes and shapes as shown in FIGS. 2 to 4.

Also, it should be noted that the grinding step for cutting a semiconductor wafer into separate chips may be omitted if the chemical etching is continued until the grooves are made deep enough to reach the front side of the semiconductor wafer.

As may be apparent from the above, a semiconductor wafer is allowed to have chip areas so arranged as to avoid the waste of semiconductor material, and the semiconductor wafer can have chip areas of different sizes and/or shapes to meet customers' demands no matter what sizes and shapes may be requested by different customers.

Use of the chemical etching permits the grooving of the street pattern in a semiconductor wafer no matter how such street pattern may be curved or bent. Particularly use of dry-etching permits the groove to be made several tens microns deep while keeping the groove several microns wide, and accordingly the number of chips per wafer can be increased.

What is claimed is:

1. A semiconductor wafer whose pattern is composed of a plurality of chip areas delimited by a plurality of streets each of which is formed along peripheries of the chips areas for cutting out the wafer at the street and separating the cut-out wafer into chips, wherein at least one or more streets are not straight.

2. A semiconductor wafer according to claim 1, wherein the pattern is composed of a plurality of rectangular chip areas of same size delimited by a plurality of streets which are wholly or partly staggered to be in conformity with arrangement of the rectangular chip areas.

3. A semiconductor wafer according to claim 1, wherein the pattern is composed of a plurality of chip areas of different shapes and/or sizes delimited by a plurality of streets which are so bent or curved that they may separate adjacent chip areas.

* * * * *